United States Patent
Kubota et al.

(10) Patent No.: US 11,826,870 B2
(45) Date of Patent: Nov. 28, 2023

(54) APPARATUS AND METHOD FOR DOUBLE-SIDE POLISHING WORK

(71) Applicant: SUMCO CORPORATION, Tokyo (JP)

(72) Inventors: Mami Kubota, Tokyo (JP); Keiichi Takanashi, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 118 days.

(21) Appl. No.: 17/251,058

(22) PCT Filed: Jun. 5, 2019

(86) PCT No.: PCT/JP2019/022350
§ 371 (c)(1),
(2) Date: Dec. 10, 2020

(87) PCT Pub. No.: WO2020/021871
PCT Pub. Date: Jan. 30, 2020

(65) Prior Publication Data
US 2021/0245321 A1    Aug. 12, 2021

(30) Foreign Application Priority Data
Jul. 24, 2018 (JP) .................................. 2018-138707

(51) Int. Cl.
*B24B 37/013* (2012.01)
*B24B 37/08* (2012.01)
*H01L 21/02* (2006.01)

(52) U.S. Cl.
CPC ............ *B24B 37/013* (2013.01); *B24B 37/08* (2013.01); *H01L 21/02024* (2013.01)

(58) Field of Classification Search
CPC ......... B24B 37/08; B24B 37/28; B24B 49/12; B24B 49/10; B24B 49/00; B24B 49/105;
(Continued)

(56) References Cited

U.S. PATENT DOCUMENTS

2006/0194511 A1    8/2006  Nagayama et al.
2014/0256227 A1*   9/2014  Aoki ..................... B24B 37/042
                                                            451/8
(Continued)

FOREIGN PATENT DOCUMENTS

JP        7-227756 A     8/1995
JP     2006-231471 A     9/2006
(Continued)

OTHER PUBLICATIONS

PE2E Translation JP 2017207455 A; Cross-section Shape Measurement Method; Nov. 24, 2017 (Year: 2017).*
(Continued)

*Primary Examiner* — Joel D Crandall
*Assistant Examiner* — Sidney D Hohl
(74) *Attorney, Agent, or Firm* — GREENBLUM & BERNSTEIN, P.L.C.

(57) ABSTRACT

Provided is a double-side polishing apparatus and a double-side polishing method for a work which make it possible to terminate double-side polishing with timing allowing a work having been polished to have a target shape. A computing unit performs a step of grouping the data of thicknesses on a work basis; a step of extracting shape components of each work; a step of identifying a position of each of the shape components in the work radial direction; a step of computing a shape distribution of the work; a step of obtaining a shape index of the work; and a step of determining timing at which the obtained shape index becomes a set value of the shape index, determined based on a difference between a target value and an actual value of the shape index in the previous batch, as timing of termination of the double-side polishing.

14 Claims, 10 Drawing Sheets

(58) Field of Classification Search
CPC ....... B24B 49/02; B24B 49/04; B24B 37/013; H01L 21/02024
See application file for complete search history.

(56) References Cited

U.S. PATENT DOCUMENTS

| | | | |
|---|---|---|---|
| 2015/0065010 A1* | 3/2015 | Miura | B24B 37/013 |
| | | | 451/262 |
| 2020/0039021 A1* | 2/2020 | Kubota | H01L 21/02016 |
| 2020/0353585 A1* | 11/2020 | Miyazaki | B24B 37/08 |
| 2021/0205948 A1* | 7/2021 | Han | B24B 7/228 |

FOREIGN PATENT DOCUMENTS

| | | | |
|---|---|---|---|
| JP | 2010-30019 A | | 2/2010 |
| JP | 2015-47656 A | | 3/2015 |
| JP | 2017-207455 A | | 11/2017 |
| JP | 2017207455 A | * | 11/2017 |
| JP | 2018-12166 A | | 1/2018 |
| JP | 2018-74086 A | | 5/2018 |

OTHER PUBLICATIONS

International Preliminary Report on Patentability issued in International Patent Application No. PCT/JP2019/022350, dated Jan. 26, 2021, along with English translation thereof.
Official Communication issued in International Bureau of WIPO Patent Application No. PCT/JP2019/022350, dated Aug. 6, 2019, along with an English translation thereof.
Chinese Office Action dated Jan. 28, 2023 issued in Chinese Patent Application No. 201980049132.4, along with corresponding English translation.

* cited by examiner

APPARATUS AND METHOD FOR DOUBLE-SIDE POLISHING WORK

TECHNICAL FIELD

This disclosure relates to a double-side polishing apparatus and a double-side polishing method for a work.

BACKGROUND

In the production of a semiconductor wafer such as a silicon wafer, which is a typical example of a work to be polished, in order to obtain a wafer having flatness quality or surface smoothness quality controlled with higher precision, a double-side polishing process is typically used, by which front and back surfaces of the wafer are polished simultaneously.

Especially in recent years, since semiconductor devices have been miniaturized and the diameter of semiconductor wafers has been increased, the flatness required of semiconductor wafers during light exposure has become more severe. Given this background, there is a strong need for a technique for terminating polishing in a timely manner.

In typical double-side polishing, in an initial stage of polishing, the whole surface of a wafer has an upward convex shape, and the wafer greatly sags at the periphery as well. Here, the thickness of the wafer is sufficiently larger than the thickness of a carrier plate. Next, as the polishing proceeds, the whole surface of the wafer becomes flatter; however, the periphery of the wafer remains sagging. Here, the thickness of the wafer is slightly larger than the thickness of the carrier plate. As the polishing proceeds further, the wafer becomes almost flat and the periphery of the wafer comes to be less sagging. Here, the thickness of the wafer is almost the same as the thickness of the carrier plate. After that, as the polishing proceeds, the shape of the wafer is gradually depressed at the center, and the periphery of the wafer comes to have a raised shape. At this point, the thickness of the wafer is smaller than the thickness of the carrier plate.

In view of the above, in order to obtain a wafer having high flatness over the whole surface and the periphery, wafers have been typically polished so that the wafers would have almost the same thickness as the carrier plate, and an operator has controlled the polishing time to control the amount of polishing.

However, the adjustment of the polishing time performed by an operator has been significantly affected by polishing conditions such as the replacement period for the secondary materials for polishing and the differences in timing of the deactivation of an apparatus. Accordingly, the amount of polishing cannot always have been controlled accurately, so it has largely relied on the experience of the operator.

On the other hand, for example, JP 2010-030019 A (PTL 1) proposes a double-side polishing apparatus for wafers, by which the thickness of a wafer being polished is measured in real time through monitoring holes (through holes) above an upper plate (or below a lower plate), and the timing of termination of the polishing can be evaluated based on the result of the measurement.

CITATION LIST

Patent Literature

PTL 1: JP 2010-030019 A

SUMMARY

Technical Problem

In conventional methods including the method of PTL 1, the timing of termination of double-side polishing is determined based on the result of measurement of wafer thickness, thus polishing can be terminated when a predetermined thickness is obtained. However, the methods have a problem in that the shape of a wafer having been polished does not agree with a target shape.

With a view to solving the above problem, it could be helpful to provide a double-side polishing apparatus and a double-side polishing method for a work which make it possible to terminate double-side polishing during the double-side polishing with timing allowing a work having been polished to have a target shape.

Solution to Problem

We propose the following features to solve the above problem.

[1] A double-side polishing apparatus for a work, including rotating plates having an upper plate and a lower plate, a sun gear provided at a center portion of the rotating plates, an internal gear provided at a peripheral portion of the rotating plates, and a carrier plate, which carrier plate is provided between the upper plate and the lower plate provided with one or more wafer retainer openings for holding the work,
  wherein one of the upper plate and the lower plate has one or more monitoring holes penetrating from a top surface to a bottom surface of the one of the upper plate and the lower plate,
  the double-side polishing apparatus for a work comprises one or more work thickness measuring devices which can measure the thickness of each work through the one or more monitoring holes in real time during double-side polishing of the work, and
  the double-side polishing apparatus comprises a computing unit for determining, during the double-side polishing of the work, timing of termination of the double-side polishing of the work, which computing unit performs:
    a first step of grouping the data of thicknesses of the works, measured using the work thickness measuring devices on a work basis;
    a second step of extracting shape components of each work from the thickness data of the work;
    a third step of identifying a position of each of the shape components on the work having been subjected to the measurement in the work radial direction;
    a fourth step of computing a shape distribution of the work from the identified position on the work in the work radial direction and the shape components of the work;
    a fifth step of obtaining a shape index of the work from the computed shape distribution of the work; and
    a sixth step of determining timing at which the obtained shape index of the work becomes a set value of the shape index of the work, determined based on a difference between a target value and an actual value of the shape index of the work in the previous batch, as timing of termination of the double-side polishing of the work, whereby terminating the double-side polishing with the determined timing of termination of the double-side polishing of the work.

[2] The double-side polishing apparatus for a work, according to [1] above, wherein the set value Y of the shape index of the work is given by the following equation (1):

$$Y=C+((A-B)/D)\times a \qquad (1),$$

where A is the target value, B is the actual value of the previous batch, C is a set value of the shape index of the work in the previous batch, D is a constant, and a is an adjustment sensitivity constant where $0<a\leq 1$.

[3] The double-side polishing apparatus for a work, according to [1] or [2] above, wherein in the third step, the position of each shape component of the work subjected to the measurement in the wafer radial direction is identified by actually measuring a distance between a center of the sun gear and a center of the monitoring hole, a rotation angle of the carrier plate, and a revolution angle of the carrier plate; or the position of each shape component of the work subjected to the measurement in the wafer radial direction is identified by calculating by simulation measurable intervals during which the thickness of the work can be measured under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable interval intervals and actually measured intervals best match.

[4] The double-side polishing apparatus for a work, according to any one of [1] to [3] above, wherein in the sixth step, a relationship between the shape index of the work and polishing time is linearly approximated, and a polishing time after which the shape index of the work become a predetermined value is determined as timing of termination of the double-side polishing of the works, from the straight line found by the approximation.

[5] The double-side polishing apparatus for a work, according to any one of [1] to [4] above, wherein in the fifth step, a relationship between the shape components of the work and the position of each shape component of the work in the work radial direction is approximated by an even function, and a shape index of the work is determined based on a maximum value and a minimum value of the even function obtained by the approximation.

[6] The double-side polishing apparatus for a work, according to any one of [1] to [5] above, wherein in the first step, thickness data of the works are grouped on a work basis based on time intervals during which the thickness data of the works are consecutively obtained.

[7] The double-side polishing apparatus for a work, according to any one of [1] to [6] above, wherein in the second step, a relationship between thickness data of the work and polishing time is approximated by a quadratic function, and a difference between the thickness data of the work and the quadratic function obtained by the approximation is used as a shape component.

[8] A double-side polishing method for a work, wherein a work is held in a carrier plate provided with one or more wafer retainer openings for holding the work; the work is sandwiched between rotating plates composed of an upper plate and a lower plate; rotation and revolution of the carrier plate are controlled by rotation of a sun gear provided at a center portion of the rotating plates and rotation of an internal gear provided at a peripheral portion of the rotating plates; and thus the rotating plates and the carrier plate are relatively rotated to simultaneously polish both surfaces of the work, one of the upper plate and the lower plate has one or more monitoring holes penetrating from a top surface to a bottom surface of the one of the upper plate and the lower plate, and the double-side polishing method for a work comprises, during double-side polishing of the work:
 a first step of grouping the data of thicknesses of the works, measured using the work thickness measuring devices on a work basis;
 a second step of extracting shape components of each work from the thickness data of the work;
 a third step of identifying a position of each of the shape components on the work having been subjected to the measurement in the work radial direction;
 a fourth step of computing a shape distribution of the work from the identified position on the work in the work radial direction and the shape components of the work;
 a fifth step of obtaining a shape index of the work from the computed shape distribution of the work; and
 a sixth step of determining timing at which the obtained shape index of the work becomes a set value of the shape index of the work, determined based on a difference between the target value and the actual value of the shape index of the work in the previous batch, as timing of termination of the double-side polishing of the work, whereby terminating the double-side polishing with the determined timing of termination of the double-side polishing of the work.

[9] The double-side polishing method for a work, according to [8] above, wherein the set value Y of the shape index of the work is given by the following equation (2):

$$Y=C+((A-B)/D)\times a \qquad (2)$$

where A is the target value, B is the actual value of the previous batch, C is a set value of the shape index of the work in the previous batch, D is a constant, and a is an adjustment sensitivity constant where $0<a\leq 1$.

[10] The double-side polishing method for a work, according to [8] or [9] above, wherein in the third step, the position of each shape component of the work subjected to the measurement in the wafer radial direction is identified by actually measuring a distance between a center of the sun gear and a center of the monitoring hole, a rotation angle of the carrier plate, and a revolution angle of the carrier plate; or the position of each shape component of the work subjected to the measurement in the wafer radial direction is identified by calculating by simulation measurable intervals during which the thickness of the work can be measured under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable interval intervals and actually measured intervals best match.

[11] The double-side polishing method for a work, according to any one of [8] to [10] above, wherein in the sixth step, a relationship between the shape index of the work and polishing time is linearly approximated, and a polishing time after which the shape index of the work become a predetermined value is determined as timing of termination of the double-side polishing of the works, from the straight line found by the approximation.

[12] The double-side polishing method for a work, according to any one of [8] to [11] above, wherein in the fifth step, a relationship between the shape components of the work and the position of each shape component of the work in the work radial direction is approximated by an even function, and a shape index of the work is determined based on a maximum value and a minimum value of the even function obtained by the approximation.

[13] The double-side polishing method for a work, according to any one of [8] to [12] above, wherein in the first step, thickness data of the works are grouped on a work basis based on time intervals during which the thickness data of the works are consecutively obtained.

[14] The double-side polishing method for a work, according to any one of [8] to [13] above, wherein in the second step, a relationship between thickness data of the work and polishing time is approximated by a quadratic function, and a difference between the thickness data of the work and the quadratic function obtained by the approximation is used as a shape component.

Advantageous Effect

According to this disclosure, the timing of termination of double-side polishing is determined based on the shape index of a work, thus the double-side polishing can be terminated during the double-side polishing with timing allowing a work having been polished to have a target shape.

DETAILED DESCRIPTION (Double-Side Polishing Apparatus for Work)

Figure 1:
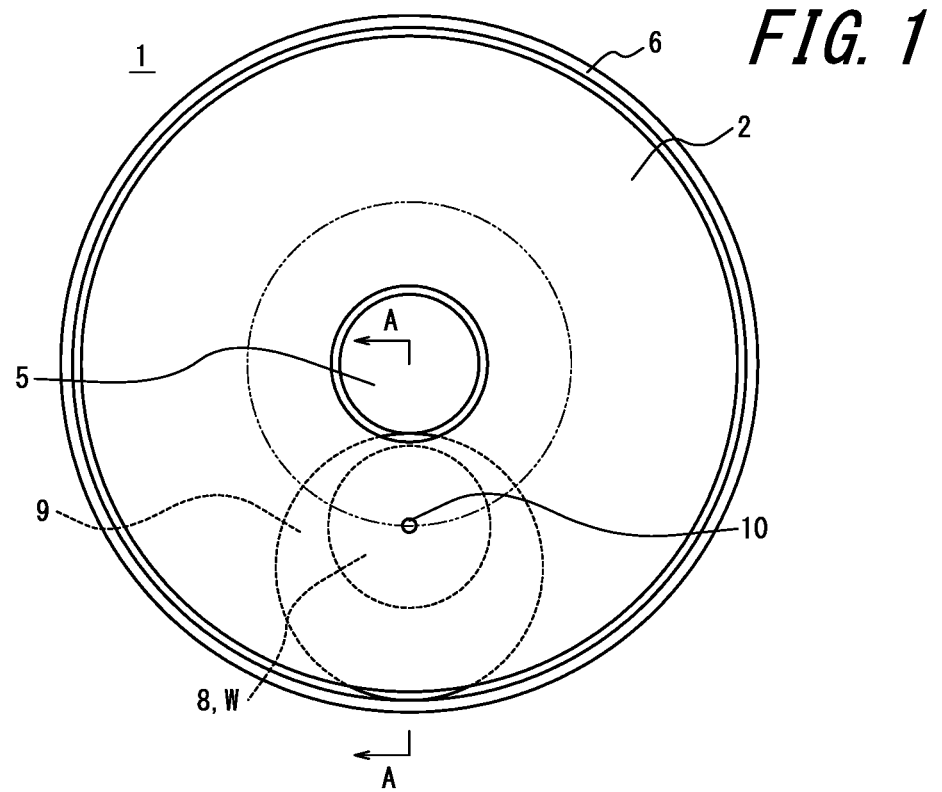
FIG. 1 is a top view of a double-side polishing apparatus for a work, according to one embodiment of this disclosure.
Figure 2:
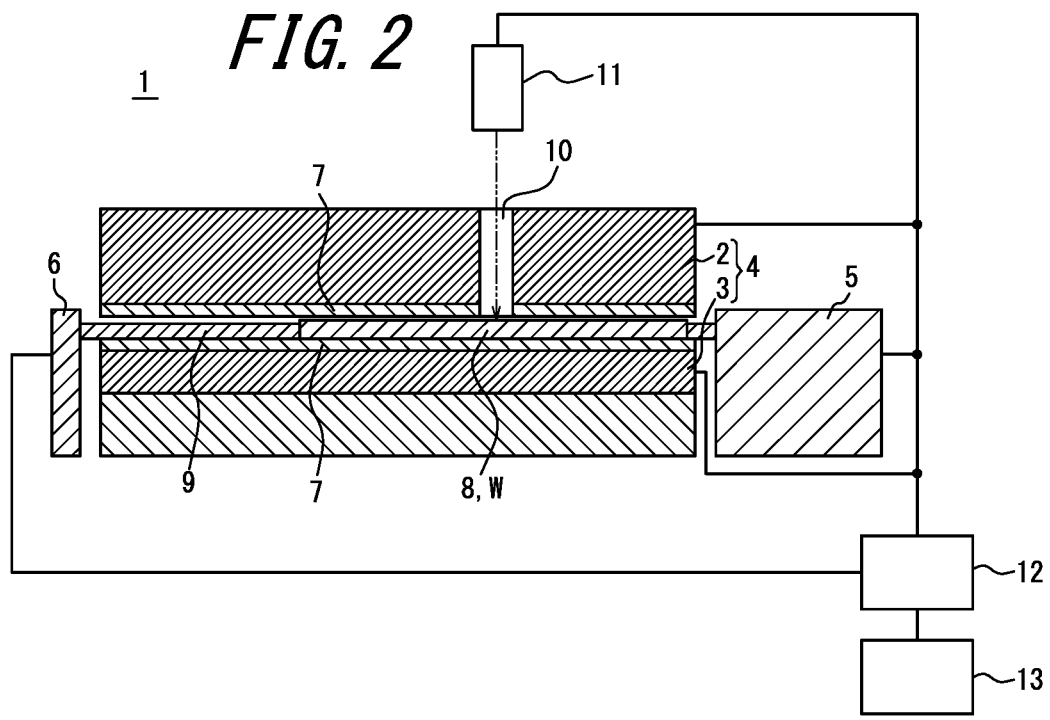
FIG. 2 is a cross-sectional view of FIG. 1 taken along line A-A.

Embodiments of a double-side polishing apparatus for a work, according to this disclosure will be described in detail with reference to the drawings. FIG. 1 is a top view of a double-side polishing apparatus for a work, according to one embodiment of this disclosure, and FIG. 2 is a cross-sectional view taken along line A-A in FIG. 1. As illustrated in FIGS. 1 and 2, the double-side polishing apparatus 1 includes rotating plates 4 having an upper plate 2 and an opposite lower plate 3; a sun gear 5 provided at the center of rotation of the rotating plates 4, and an internal gear 6 provided in a ring shape around the rotating plates 4. As depicted in FIG. 2, surfaces of the upper and lower rotating plates 4 that face each other, namely, the bottom surface of the upper plate 2 that is a polishing surface and the upper surface of the lower plate 3 that is a polishing surface are each provided with a polishing pad 7 attached thereto.

Further, as illustrated in FIG. 1 and FIG. 2, the apparatus 1 has a plurality of carrier plates 9 having one or more (one in the illustration) wafer retainer openings 8 for holding works. The carrier plates 9 are provided between the upper plate 2 and the lower plate 3. In FIG. 1, only one of the plurality of carrier plates 9 is depicted. The number of the wafer retainer openings 8 may be one or more, for example, may be three. In the illustration, a work (a wafer in this embodiment) W is held in the wafer retainer opening 8.

Here, the apparatus 1 is a planetary gearing double-side polishing apparatus which can rotate the sun gear 5 and the internal gear 6 to cause planetary motion involving the orbital motion and the rotational motion of the carrier plate 9. In other words, while a polishing slurry is supplied, the carrier plates 9 are made to perform planetary motion and at the same time, the upper plate 2 and the lower plate 3 are relatively rotated with respect to the carrier plates 9. Thus, both surfaces of the wafers W can be polished simultaneously by making the polishing pads 7 attached to the upper and lower rotating plates 4 rubbed against the respective surfaces of the wafers W held in the wafer retainer openings 8 of the carrier plates 9.

Further, as illustrated in FIG. 1 and FIG. 2, in the apparatus 1 of this embodiment, the upper plate 2 is provided with one or more monitoring holes 10 penetrating from the top surface of the upper plate 2 to the bottom surface thereof, which is a polishing surface. In the illustration, one monitoring hole 10 is placed at a position such that it passes over the wafer W around the wafer's center. In this example, the monitoring hole 10 is provided in the upper plate 2. Alternatively, the hole may be provided in the lower plate 3, and one or more monitoring holes 10 may be provided in one of the upper plate 2 and the lower plate 3. Further, in the illustrations of FIG. 1 and FIG. 2, one monitoring hole 10 is provided; alternatively, a plurality of holes may be placed in an orbit on the upper plate 2 (on the dot-dashed line in FIG. 1). Here, as illustrated in FIG. 2, the monitoring hole 10 penetrates through the polishing pad 7 attached to the upper plate 2, and penetrates from the top surface of the upper plate 2 to the bottom surface of the polishing pad 7.

Further, as depicted in FIG. 2, the apparatus 1 includes, above the upper plate 2 in the illustration, one or more (one in the illustration) work thickness measuring devices 11 which can measure the thicknesses of the wafers W through the one or more (one in the illustration) monitoring holes 10 in real time during double-side polishing of the wafers W. In this example, the work thickness measuring devices 11 are wavelength tunable infrared laser devices. For example, the work thickness measuring devices 11 may include an optical unit for irradiating the wafers W with a laser beam, a detection unit for detecting the laser beam reflected from the wafer W, and a calculating unit for calculating the thickness of the wafer W from the detected laser beam. Such work thickness measuring devices 11 make it possible to calculate the thickness of the wafers W from the difference between the optical path lengths of a reflection component of the laser beam incident on the wafer W, reflected at the front surface of the wafer and a reflection component thereof reflected at the back surface of the wafer W. Note that the work thickness measuring devices 11 may be of any type as long as the thickness of works can be measured in real time; accordingly, they are not limited in particular to the type using infrared laser as described above.

Further, as depicted in FIG. 2, the double-side polishing apparatus 1 of this embodiment includes a control unit 12. As illustrated in FIG. 2, in this example, the control unit 12 is connected to the upper and lower plates 2 and 3, the sun gear 5, the internal gear 6, and the work thickness measuring devices 11.

The double-side polishing apparatus 1 includes a computing unit 13 for determining, during double-side polishing of works, timing of termination of the double-side polishing of the works, which computing unit is connected to the control unit 12. The computing unit 13 acquires data of the thicknesses of the works measured using the thickness measuring devices 11 and determines timing of termination of double-side polishing of the works. The operation of the computing unit 13 will now be described with reference to a case where one work thickness measuring device 11 including an infrared laser is provided, the number of monitoring holes 10 provided in the upper plate 2 is five, the holes are provided at regular intervals in the circumferential direction of the upper plate 2, the number of the carrier plates 9 is five, and one wafer W as a work is held in each carrier plate 9.

The thicknesses of the wafers W measured by the work thickness measuring devices 11 are accurately measured when the surfaces of the wafers W are irradiated with laser light emitted from the work thickness measuring device 11 through the monitoring holes 10 in the upper plate 2.

On the other hand, when laser light does not pass through the monitoring holes 10 and illuminates the top surface of the upper plate 2; or when laser light passes through the monitoring holes 10, but illuminates the surface of the carrier plates 9 instead of the surface of the wafers W, the thicknesses of the wafers W are not acquired. Hereinafter, a continuous time interval during which the thicknesses of the wafers W are measured using the work thickness measuring devices 11 is referred to as a "measurable interval", and each interval during which the thicknesses of the wafers W are not measured accurately is referred to as an "immeasurable interval".

In some cases, the shapes of the wafers W cannot be accurately evaluated even when using data obtained with respect to the measurable intervals if the data greatly vary. In such a case, the shapes of the wafers W can be evaluated by averaging the data corresponding to each monitoring hole 10, obtained with respect to the measurable intervals.

Specifically, as described above, since the upper plate 2 has five monitoring holes 10 for measuring thickness, when the upper plate 2 is rotated at for example 20 rpm (3 s cycle), laser light from the work thickness measuring device 11 passes through the monitoring holes 10 at intervals of 0.6 s. Further, when the time required for the passage through the diameter of the monitoring holes 10 (for example, 15 mm) is 0.01 s, the time interval between a measurable interval of a certain monitoring hole 10 and the next measurable interval, that is, an immeasurable interval is 0.01 s or more and 0.59 s or less. Accordingly, when the immeasurable interval is 0.01 s or more and 0.59 s or less as described above, consecutive data measured up to the immeasurable interval are regarded as data obtained by consecutive measurements on one of the monitoring holes 10 and are averaged, and the measurement is determined to proceed to the next monitoring hole 10. Further, an immeasurable interval may be observed even when a monitoring hole 10 passes right below the work thickness measuring device 11 if no wafer W is present under the hole. Therefore, when the measurement proceeds from one of the monitoring holes 10 currently subjected to the measurement to the second one over the next monitoring hole 10, the time interval between the current measurable interval and the next measurable interval, that is, the immeasurable interval is 0.59 s or more and 1.19 s or less.

Further, even data averaged as described above may include outliers observed for example when the thickness of the outermost peripheral portion of a wafer is measured. In some cases where the data include outliers as described above, the shape of the wafer W cannot be accurately evaluated. Accordingly, outliers are preferably removed first from the measured thickness data.

Figure 3:
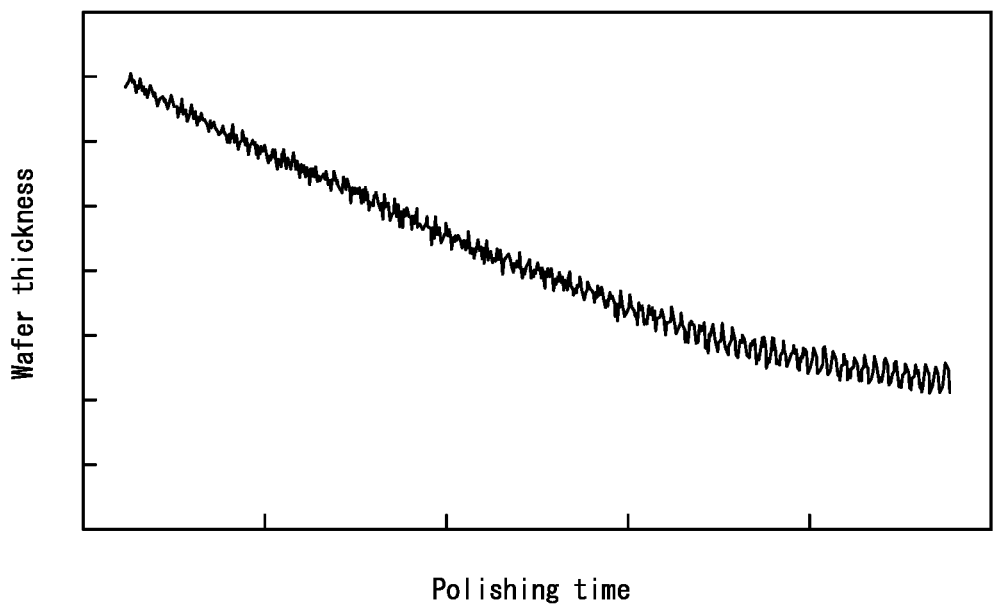
FIG. 3 is a diagram illustrating example thickness data of wafers, from which outliers have been removed.

The removal of the outliers can be performed based on the initial thickness of the carrier plates 9, the initial thickness of the wafers W, etc. Further, with a certain number of measurement values of the wafer thickness obtained, statistically, for example, the data of the measured values of which standard deviation exceeds a predetermined value (for example, 0.2 μm) may be removed as outliers. Hereinafter, the values left after removing the outliers are referred to as "normal values". FIG. 3 illustrates example thickness data of the wafers W, from which outliers have been removed.

When the wafers W are double-side polished under typical polishing conditions, measurable intervals and immeasurable intervals for the thickness of the wafers W alternately occur; for example, a measurable interval occurs and an immeasurable interval then occurs, followed by the occurrence of another measurable interval. Here, the occurrence of an immeasurable interval means that the wafer W irradiated with laser light is changed. Thus, the data of the thicknesses measured in measurable intervals can be grouped for each wafer using such an occurrence of an immeasurable interval as an indication (first step).

Studies made by the inventors of this disclosure revealed that when the thickness of one wafer W held in one carrier plate 9 is measured in a measurable interval, and an immeasurable interval occurs after that; the wafer W of which thickness is measured in the next measurable interval is not always a wafer held in an adjacent carrier plate 9, but may be a wafer held in a carrier plate 9 which is two or more carrier plates away from the original carrier plate 9.

Specifically, a case where carrier plates 9 labeled A, B, C, D, and E arranged in a circle revolve so that the carrier plates move toward the work thickness measuring devices 11 in the order of A, B, C, D, E, A, B, . . . is assumed. When the thickness of the wafer W held in the carrier plate 9 labeled A is measured, an immeasurable interval occurs, a wafer W to be subjected to a measurement in the following measurable interval may be the wafer W held in the carrier plate 9 labeled C two carrier plates away from the carrier plate 9 labeled A. In this case, the time period of the immeasurable interval is longer than in the case where the wafer W in the adjacent carrier plate 9 labeled B is subjected to the measurement.

Accordingly, for example, whether the thickness of the wafer W in the carrier plate 9 labeled B was measured or the thickness of the wafer W of the carrier plate 9 labeled C or D was measured after the wafer W in the carrier plate 9 labeled A can be determined based on the time period of the immeasurable interval, that is, the time interval between the measurable interval and the next measurable interval. Thus, the thickness data of the wafers W can be correctly grouped on a wafer W basis.

Figure 4:
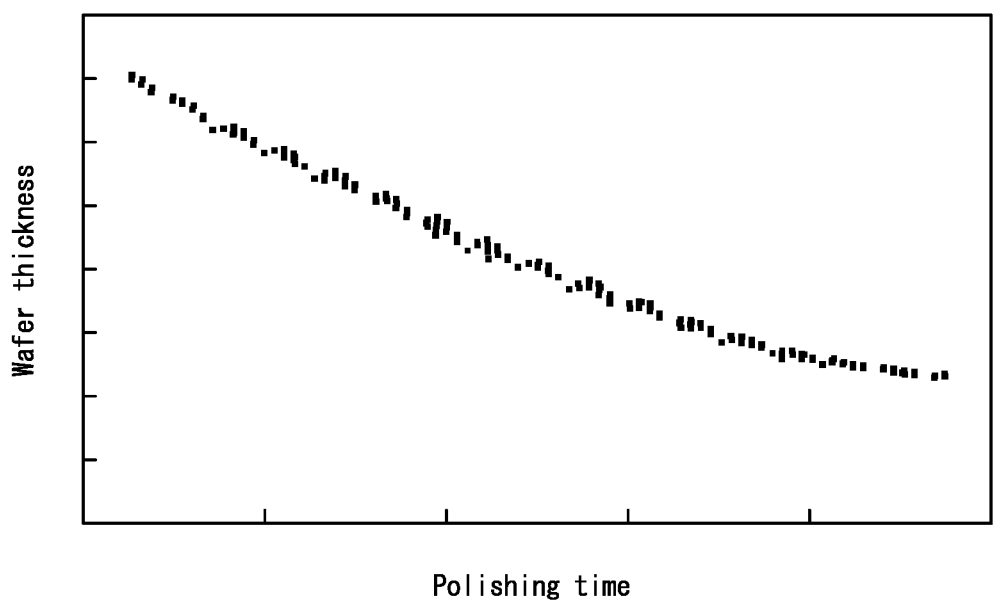
FIG. 4 is a diagram illustrating the thickness data of one wafer W, separated from the thickness data given in FIG. 3.

FIG. 4 illustrates the thickness data of one wafer W, separated from the thickness data given in FIG. 3. Although not shown, also for the other four wafers W, the thickness data of the wafers W exhibiting similar tendencies illustrated in FIG. 4 are obtained.

Next, the thickness data of the wafers W grouped on a wafer W basis are subjected to the following steps. First, the shape components of the wafers W are extracted from the thickness data of the wafers W (second step). The thicknesses of each wafer W grouped in the first step are reduced as the polishing time is increased. Namely, since the average thickness of the wafer W is reduced as the polishing time is increased, the thickness data obtained in the first step not only include changes in the shape components of the surface of the wafer W with time but also changes in the average thickness of the wafer W with time. Accordingly, the changes in the shape components of the surface of the wafer W with time are extracted by removing the changes in the average thickness of the wafer with time from the thickness data of the wafer W.

Figure 5:
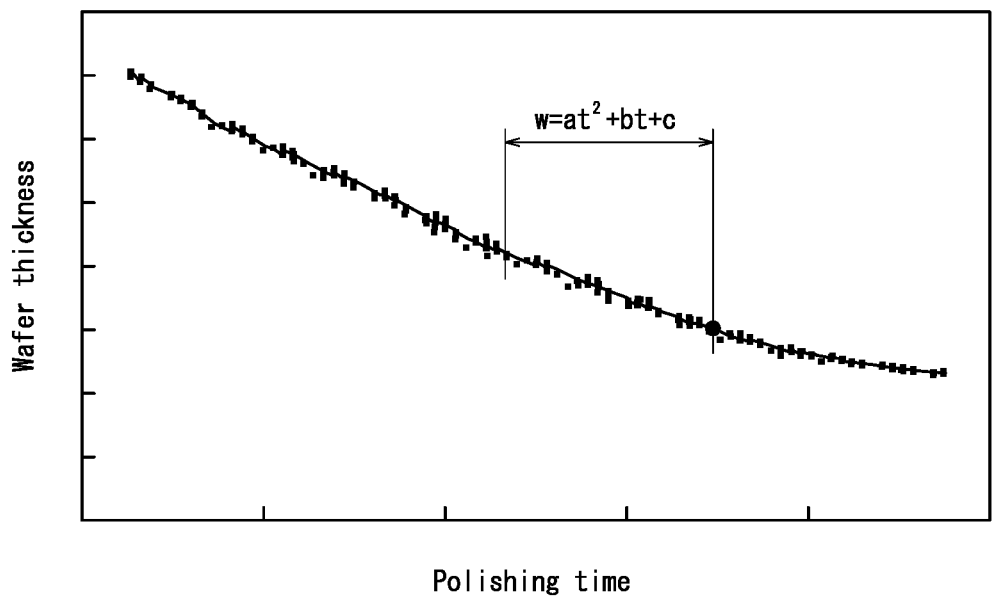
FIG. 5 is a diagram illustrating change in the average thickness of the wafer with time, which average thickness has been obtained by approximating the thickness data of the wafer given in FIG. 4 by a quadratic function.

The changes in the average thickness of the wafer W can be approximated by a quadratic function. FIG. 5 illustrates change in the average thickness of the wafer W with time, which average thickness has been obtained by approximating the thickness data of the wafer W given in FIG. 4 by a quadratic function. As illustrated in the diagram, the thickness data of the wafer W can be well fitted with a quadratic function. Thus, changes in the average thickness of the wafer W with time can be obtained. Next, the changes in the average thickness of the wafer W obtained as described above are subtracted from the thickness data of the wafer W. Thus, the changes in the shape components of the surface of the wafer W with time can be extracted. The obtained changes in the shape components with time are given in FIG. 6.

Figure 7:
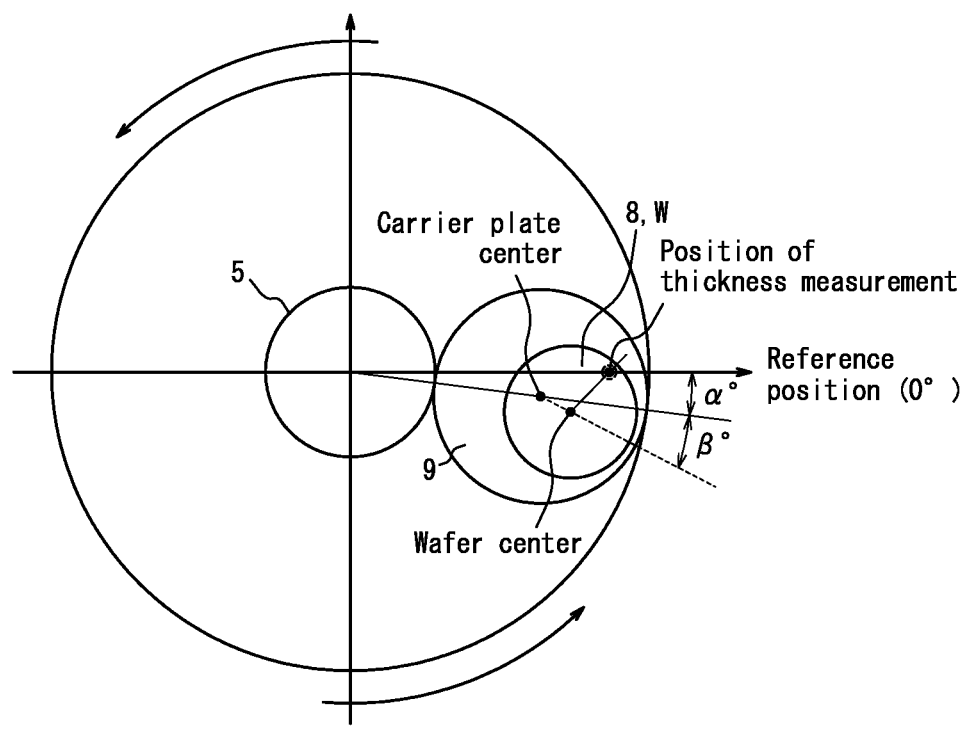
FIG. 7 is a diagram illustrating an example of the positional relationship between a carrier plate and a wafer at a time point when the thickness of the wafer is measured.

Subsequently, for each shape component of the wafer W extracted as described above, the position in the wafer radial direction of the wafer W subjected to the measurement, that is, the distance of the position from the wafer center is determined (third step). FIG. 7 illustrates an example of the positional relationship between the carrier plate 9 and the wafer W at a time point when the thickness of the wafer W is measured. In this diagram, the thickness measurement position (that is, the position of the wafer thickness measuring device 11 or the position of the center of the monitoring hole 10) lies on the reference line, and the distance from the center of the sun gear 5 to the thickness measurement position (namely, the distance from the center of the sun gear 5 to the center of the monitoring hole 10) is a design value and is known. Similarly, the radii of the rotating plates 4, sun gear 5, and the carrier plate 9; and the distance from the center of the carrier plate 9 to the center of the wafer W are also design values and are known.

Further, $\alpha$ is the revolution angle of the carrier plate 9, which is an angle between the reference position (reference line) and the line joining the center of the sun gear 5 and the center of the carrier plate 9. Further, $\beta$ indicates the rotation angle of the carrier plate 9, which is an angle between the line joining the center of the sun gear 5 and the center of the carrier plate 9 and the line joining the center of the carrier plate 9 and the center of the wafer W.

Not only in the double-side polishing apparatus 1 of this disclosure, but in typical double-side polishing apparatuses, the angle from the reference position (reference line) (or the displacement) is monitored and controlled using a device called an "encoder" in order to check whether the rotating plates 4 and the carrier plates 9, etc. are rotated under predetermined conditions. Accordingly, the revolution angle $\alpha$ and the rotation angle $\beta$ at the time point of measurement of the thickness of the wafer W can be determined. Further, the center position of the carrier plate 9 can be determined from the determined revolution angle $\alpha$, and the center position of the wafer W can be determined from the rotation angle $\beta$. As described above, since the distance from the center of the sun gear 5 to the thickness measurement position (i.e., the center of the monitoring hole 10) is known, the distance from the center of the wafer W to the thickness measurement position, that is, the position of each shape component of the wafer W in the wafer radial direction can be found.

Thus, the position of each shape component of the wafer W in the wafer radial direction can be determined from the radii of the rotating plates 4, the sun gear 5, and the carrier plate 9 that are design values; the distance from the center of the carrier plate 9 to the center of the wafer W; the position of the wafer thickness measuring device 11 (namely, the distance from the center of the sun gear 5 to the center of the monitoring hole 10); and (1) the revolution angle $\alpha$ of the carrier plate 9 and (2) the rotation angle $\beta$ of the carrier plate 9 at the time of measurement of the thickness of the wafer W.

As described above, (1) the revolution angle $\alpha$ of the carrier plate and (2) the rotation angle $\beta$ of the carrier plate 9 can be found by actual measurement. However, high accuracy is required for the actual measurement of those values. Accordingly, it is preferred that the position of each shape component of the wafer W in the wafer radial direction is preferably found by determining (1) and (2) by simulation from the pattern of measurable intervals in a certain time period (for example, 200 s) from the start of polishing.

Specifically, polishing conditions of: the rotation speed (rpm) of the upper plate 2, the revolution number (rpm) of the carrier plate 9 and the rotation number (rpm) of the carrier plate 9; and the initial position of the wafer W (the revolution angle $\alpha$ and the rotation angle $\beta$ of the wafer W from the reference position (reference line) in FIG. 7) are given as parameters. Thus, the time pattern (that is, the pattern of the measurable intervals) in which the thickness of the wafer W is measured and the relevant position subjected to the thickness measurement (that is, the position of the shape component of the wafer W in the wafer radial direction) can be found by simulation.

Further, the rotation speed (rpm) of the upper plate 2, the revolution number (rpm) of the carrier plate 9, and the rotation number (rpm) of the carrier plate 9 at which the pattern of the measurable intervals found by simulation best matches with the pattern of the measurable intervals obtained by actual measurement are found to identify the positions where the thickness is measured. Thus, the position of each shape component of the wafer W in the wafer radial direction can be determined by simulation.

Next, from the identified positions on the wafer W in the wafer radial direction and the shape components of the wafer W, the shape distribution of the wafer W is computed (fourth step). This can be computed using the shape components corresponding to different measurement positions. In this disclosure, the shape distribution of the wafer W after a polishing time t is found using the shape component obtained from the thickness data obtained from the polishing time t-Δt to the polishing time t.

Figure 6:
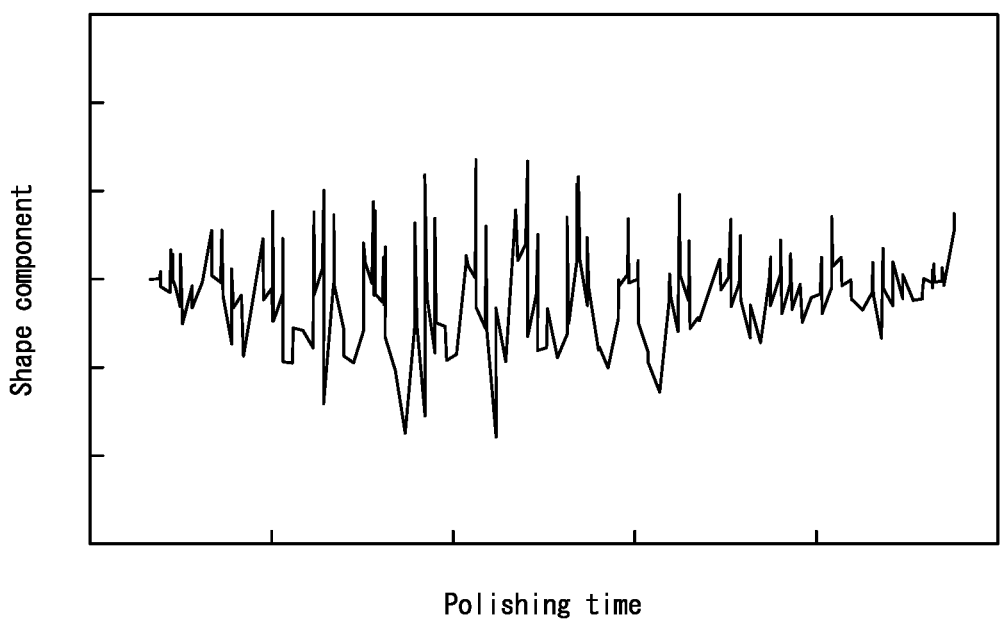
FIG. 6 is a diagram illustrating changes in the shape component of the surface of the wafer with time, which shape component has been extracted from the thickness data of the wafer given in FIG. 4.
Figure 8A:
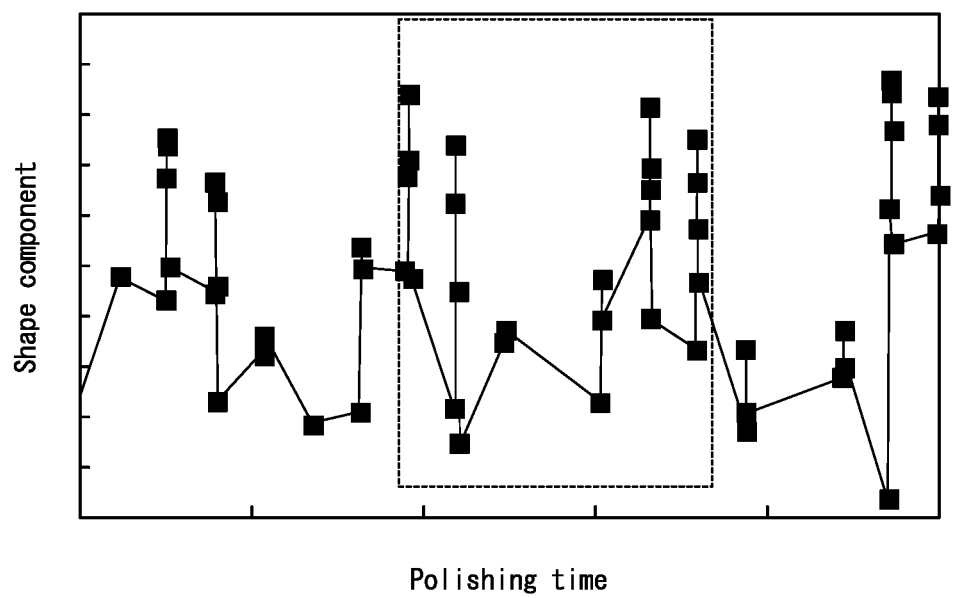
FIG. 8A is an enlarged view of a part of the change in the shape distribution illustrated in FIG. 6, corresponding to the polishing time from 500 s to 1000 s.

FIG. 8A presents an enlarged view of a part of the change in the shape distribution illustrated in FIG. 6, corresponding to the polishing time from 500 s to 1000 s. For example, the shape distribution of the wafer W at a polishing time of 880 s is determined using the shape components corresponding to from 680 s to 880 s in the illustration. The obtained shape distribution is given in FIG. 8B. As is clear from the above description, the obtained shape distribution of the wafer W is not the shape distribution after the polishing time t but exhibits the average shape distribution of the wafer W from the polishing time t-Δt to t.

The time range for the shape components used to determine the above shape distribution depends on the number of measurable data per unit time and depends on the polishing conditions, and so cannot be determined unconditionally. The longer the time range is, the more accurate the shape distribution can be, which on the other hand requires more time for the computation of the shape distribution and limits the rate of computation. By contrast, the shorter the time range is, the shorter the time required to compute the shape distribution, which is advantageous in terms of the rate of computation, yet limits the accuracy of the shape distribution. The inventors found that the shape distribution of the wafer W can be determined with high accuracy without sacrificing the high rate of computation by determining the shape distribution using the shape components of a time range of for example 75 s or more. It is more preferred that the shape distribution of the wafer W is determined using the shape components of a time range of 200 s or more and 300 s or less.

Next, the shape index of the wafer W is determined from the shape distribution of the wafer W computed as described above (fifth step). One of the indices representing the flatness of the wafer W is the global backside ideal range (GBIR). A GBIR is an exemplary index representing the global thickness of the whole wafer and is used to evaluate nonuniformity in the thickness of the entire wafer. The GBIR can be found as the difference between the maximum value and the minimum value in the shape distribution of the wafer W.

In this disclosure, the GBIR is used as a shape index of the wafer W. However, the obtained GBIR is also the average GBIR of the shape components for a time range from t-Δt to t, used for the computation of the shape distribution, so is not a GBIR in a strict sense. For this reason, the difference between the maximum value and the minimum value of the shape distribution is herein expressed as "shape index of wafer W".

Figure 8B:
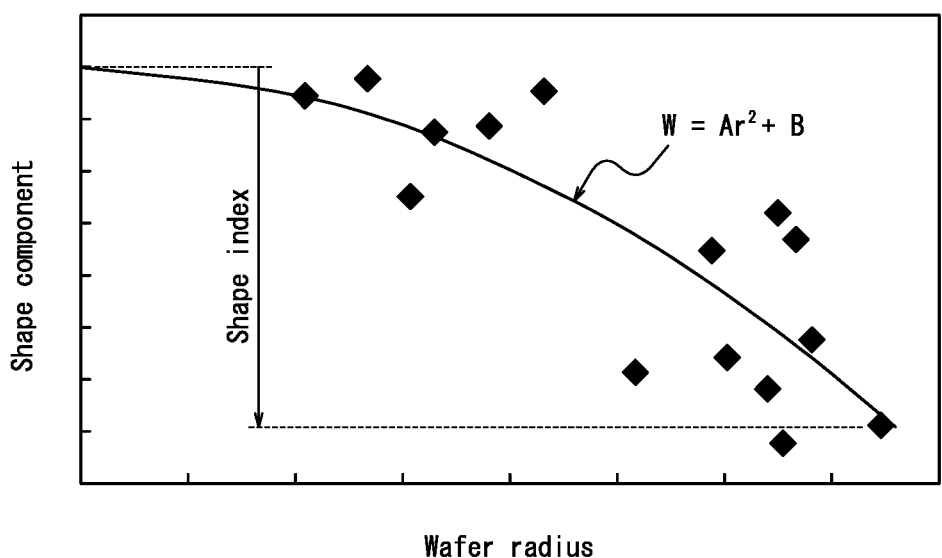
FIG. 8B is a shape distribution obtained from FIG. 8A.

It should be noted that as in the example illustrated in FIG. 8B, when the number of shape components is not sufficient, the shape distribution is approximated by an even function; the maximum value and the minimum value are found from the shape distribution of the wafer W expressed by the obtained even function; and the shape index of the wafer W can be calculated from the difference between the determined maximum value and the minimum value.

When the shape components in the vicinity of the center of the wafer W are obtained, a biquadratic function is preferably used as the even function, since the shape distribution of the wafer W can be well reproduced. On the other hand, when the shape profile in the vicinity of the center of the wafer W is not obtained, a quadratic function is preferably used, since the shape distribution of the wafer W can be well reproduced.

Thus, after the shape index of the wafer W is determined for each wafer W, timing at which the obtained shape index of the wafer W becomes a set value of the shape index of the work, determined based on the difference between a target value and an actual value of the shape index of the wafer W in the previous batch, is determined as timing of termination of the double-side polishing of the work (sixth step). Specifically, the average of the shape indices of the wafers is calculated, and the timing of termination of double-side polishing of the wafers W is determined based on the average.

Figure 9:
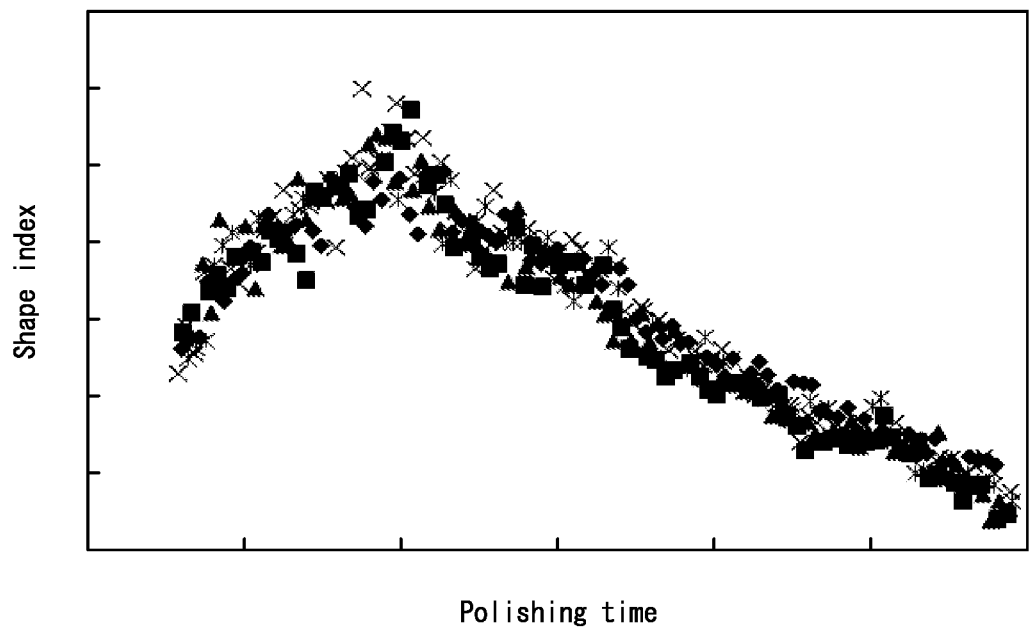
FIG. 9 is a diagram illustrating the relationship between the average of the shape indices of wafers and the polishing time.

FIG. 9 illustrates the relationship between the average of the shape indices of the wafers W and the polishing time. In practice, double-side polishing is terminated with timing when the shape index of the wafers W becomes a predetermined value, for example, zero.

Figure 10:
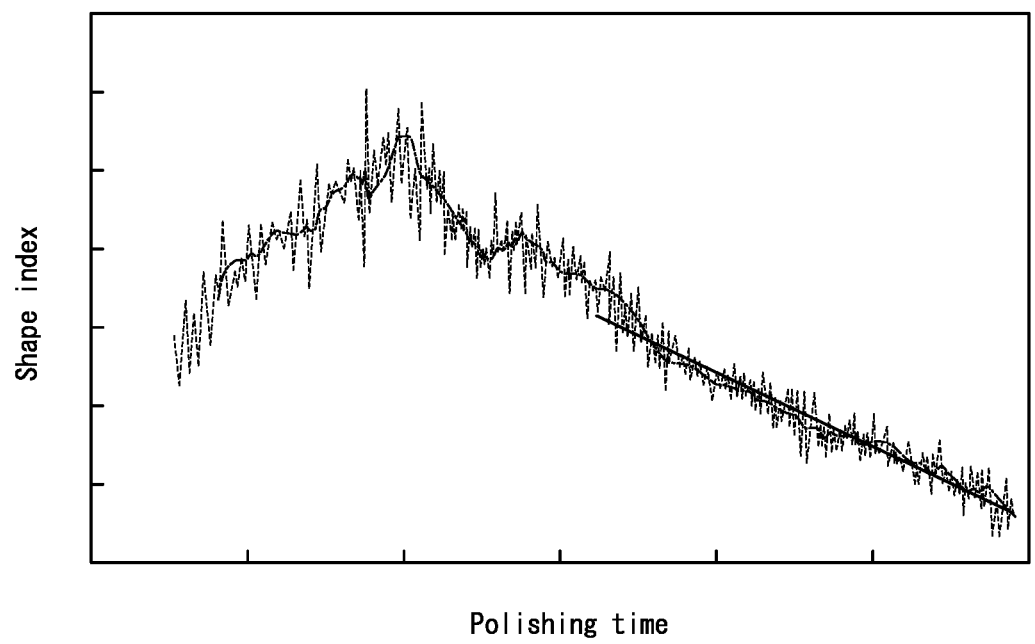
FIG. 10 is a diagram illustrating the shape indices of the wafers, having been linearly approximated.

Typically the surface of each wafer W subjected to double-side polishing is relatively flat before polishing, and after double-side polishing starts, the surface shape of the wafer changes and the flatness is degraded once, so the GBIR increases. However, as the double-side polishing proceeds, the flatness improves, and the GBIR starts to decrease. As the double-side polishing proceeds, the GBIR exhibits a tendency to linearly decrease with the polishing time. The shape indices of the wafers W of this disclosure linearly decrease after the values start to decrease and exhibit a similar tendency to the GBIR. Accordingly, after the shape indices of the wafers W start to decrease, as illustrated in FIG. 10, the time when the shape indices of the wafers W become a predetermined value (for example, zero) can be predicted by linearly approximating the shape indices. According to the studies made by the inventors, the timing of termination of the double-side polishing is determined based on the shape indices of wafers W that are being double-side polished, thus the double-side polishing can be terminated with timing allowing wafers W having been polished to have a target shape.

As a result of further studies of the inventors, in the case where a batch process of double-side polishing of wafers W was repeated and the number of batches was small, double-side polishing was successfully terminated with timing such that the shape of the wafers W would be a target shape if double-side polishing was successfully terminated when the shape index of the wafers W became a predetermined value. However, as the number of batches increases the shapes of the wafers W were found to be deviated from the target shape.

Figure 11:
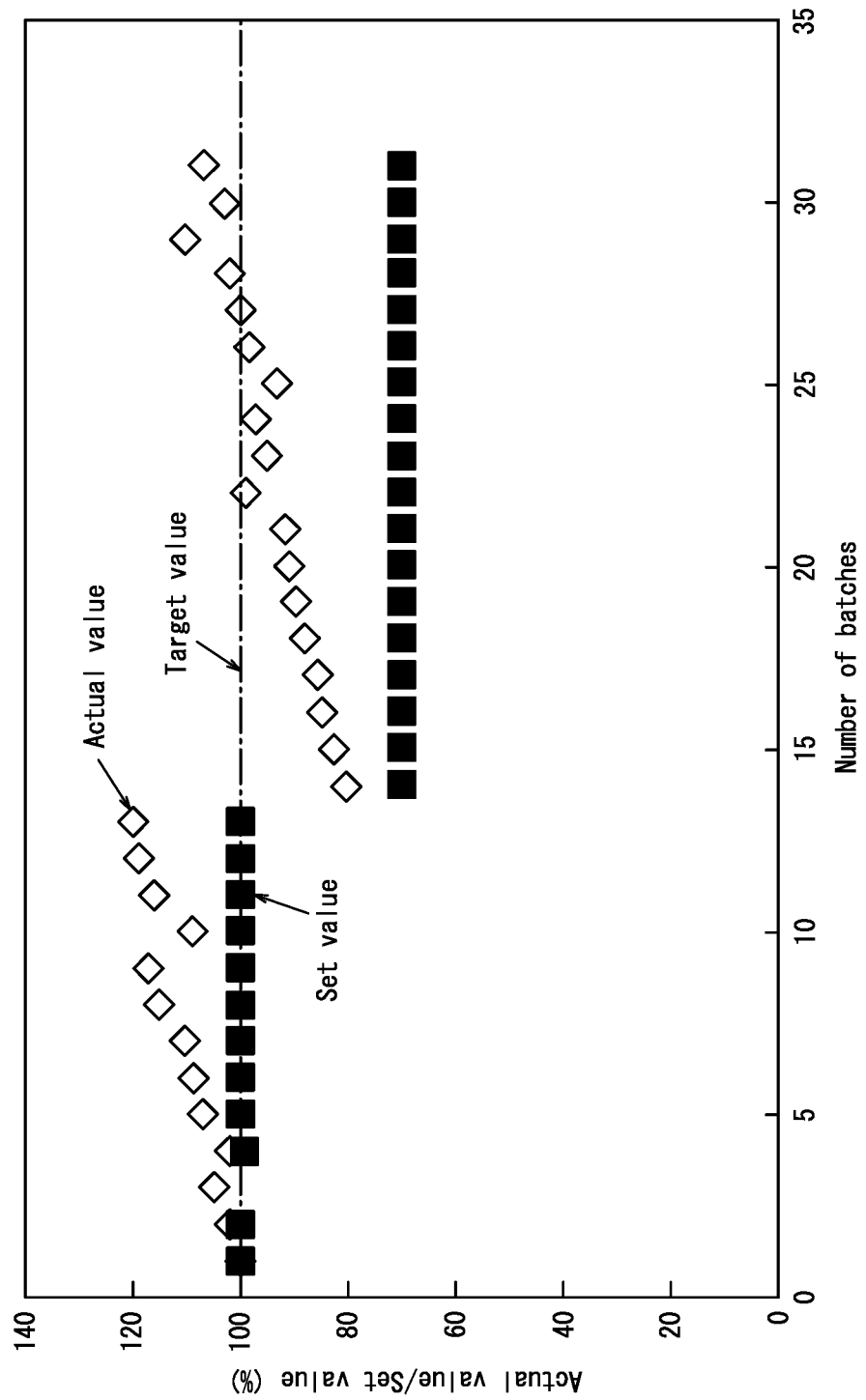
FIG. 11 is a diagram illustrating the deviation of the shape of a wafer after double-side polishing from a target shape through repetition of double-side polishing.

Specifically, for example in a case where the target shape for the wafers W is represented as GBIR=100 nm as illustrated in FIG. 11, performing double-side polishing using a set value of the shape index of the wafers W for termination of double-side polishing that is set to a target value of 100 nm results in a GBIR of the wafers W having been double-side polished of 100 nm that is the target value when the number of batches is small. However, as the number of batches increases, the actual value of the GBIR is gradually increased and the shape of the wafer W is gradually deviated from the target shape.

When the set value of the shape index is reduced (to 70 nm in the example of FIG. 11) with a view to reducing such a deviation and obtaining wafers W having the target GBIR=100 nm, the value of the GBIR of the wafers W having been double-side polished once becomes smaller than the target value and increases with the increase of the number of batches to reach the target value. However, if the number of batches is increased further, the shape of wafers W having been double-side polished will deviate from the target shape again.

As a cause of such a deviation of the shape, the life variation of secondary materials such as the polishing pads 7, the carrier plate 9, and the slurry is considered; however, replacing the secondary materials after each several batches during which the shape deviation as described above does not occur is difficult in terms of cost. Accordingly, it is necessary that the deviation of the shape is reduced by a method capable of complying with the life variation of the secondary materials due to the increase of the number of batches.

The inventors of this disclosure have intensively studied ways to avoid the above deviation of the shape. As is clear from FIG. 11, the shape of the wafer W is linearly deviated from a target shape with respect to the life variation of the secondary materials. The inventors of this disclosure found that when timing of terminating double-side polishing of the wafers W is determined, the deviation of the shape described above can be reduced by correcting the set value of the shape index of the wafers W corresponding to the timing of termination of double-side polishing in the current batch based on the difference between the actual value and the target value of the shape index of the wafers W having been double-side polished in the previous batch.

A detailed analysis made by the inventors, of the relationship between the set value and the actual value of the shape index of multiple wafers W in termination of double-side polishing revealed that the deviation of the shape described above was favorably reduced by setting the set value of the shape index of the wafers W in termination of double-side polishing in the current batch as Y given by the following equation (3):

$$Y=C+((A-B)/D)\times a \quad (3),$$

where A is the target value, D is a constant, B is the actual value of the wafers W in the previous batch, C is a set value of the shape index of the wafers W in the previous batch, and a is an adjustment sensitivity constant (0<a≤1).

The constant D in the above equation (3) can be calculated by performing statistical analysis on the target value A and the actual value B of the multiple wafers W having been double-side polished. For example, the value of D was calculated to be 0.665693 in Example below. Further, the adjustment sensitivity constant α is a constant for adjusting the effect of the actual value of the shape index in the previous batch in determining a set value of the shape index of the wafers W in the current batch. The constant α is set to be a value larger than 0 and 1 or smaller, thereby reducing the effect of measurement errors concerning the actual value due to the disturbance caused by the life variation of the secondary materials such as the polishing pads 7, carrier plate 9, and slurry at the time of measurement of the shape index of the wafers in the previous batch. The value a above may be set to, for example, 0.2.

Figure 12:
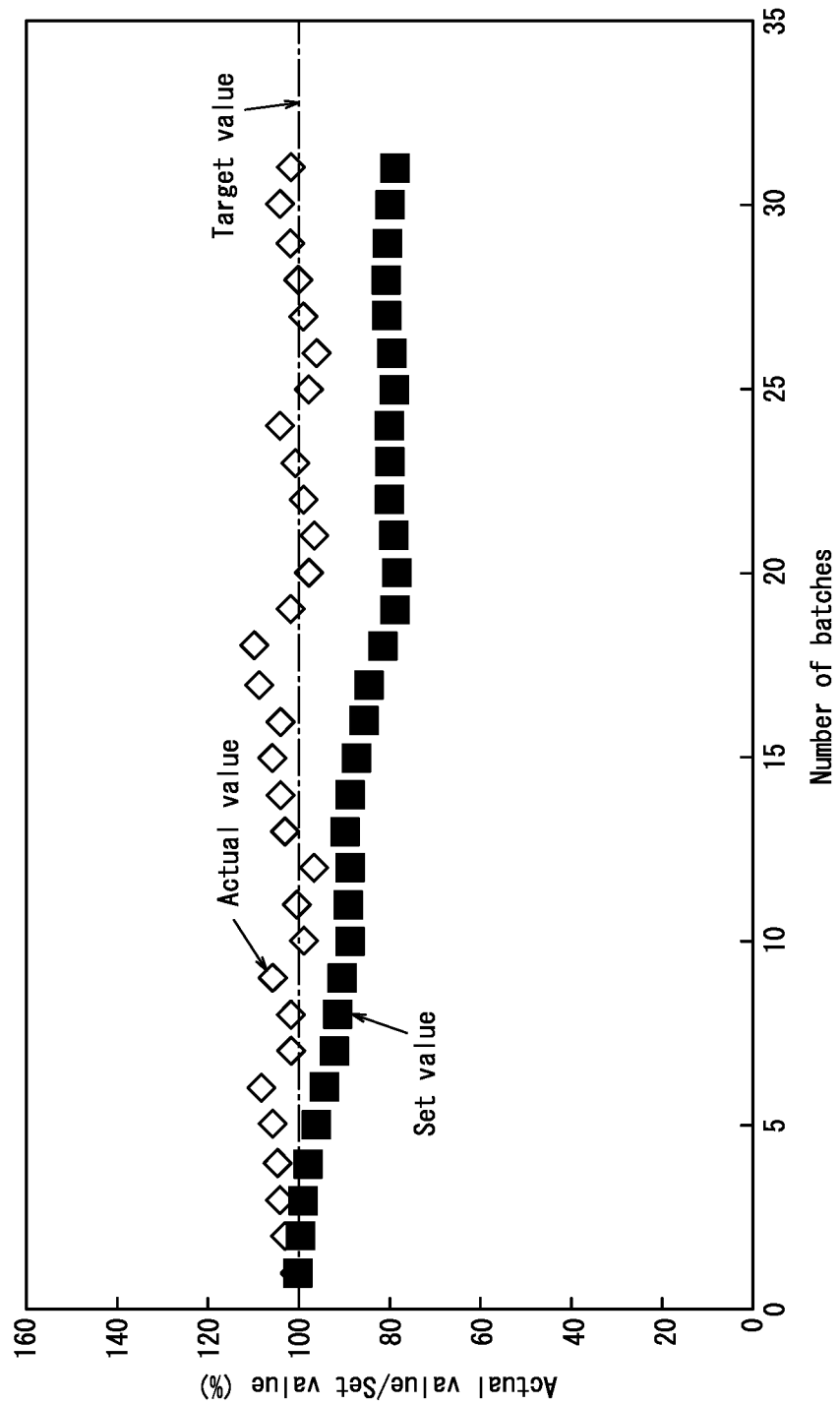
FIG. 12 is a diagram illustrating how a wafer having a target shape can be obtained by correcting timing of termination of double-side polishing even when double-side polishing is repeated.

FIG. 12 illustrates the relationship between the number of batches and the GBIR in cases where timing of termination of double-side polishing is determined using the above equation (3). In FIG. 12, a GBIR is given as an actual value (%) relative to a set value. As is clear from the diagram, the set value of the shape index of the wafers W corresponding to the timing of termination of double-side polishing determined using the above equation (3) gradually decreases as the number of batches increases. On the other hand, the diagram indicates that the actual value of the GBIR of the wafers W having been double-side polished is kept close to the target value even when the number of batches increases.

Thus, after the shape index of the wafer W is determined for each wafer W, timing at which the obtained shape index of the wafer W becomes a set value of the shape index of the work, determined based on the difference between a target value and an actual value of the shape index of the wafer W in the previous batch, is determined as timing of termination of the double-side polishing of the work. Terminating double-side polishing with timing determined as described above allows for termination of double double-side polishing in such a manner that the wafer W will have a target shape even when double-side polishing is performed repeatedly.

(Method of Double-Side Polishing Work)

Next, a double-side polishing method for a work, according to one embodiment of this disclosure will be described. In the method of this embodiment, double-side polishing of the wafers W can be performed, using for example, the apparatus depicted in FIG. 1 and FIG. 2. Since the structure of the apparatus depicted in FIG. 1 and FIG. 2 has already been described, the description will not be repeated.

Figure 13:
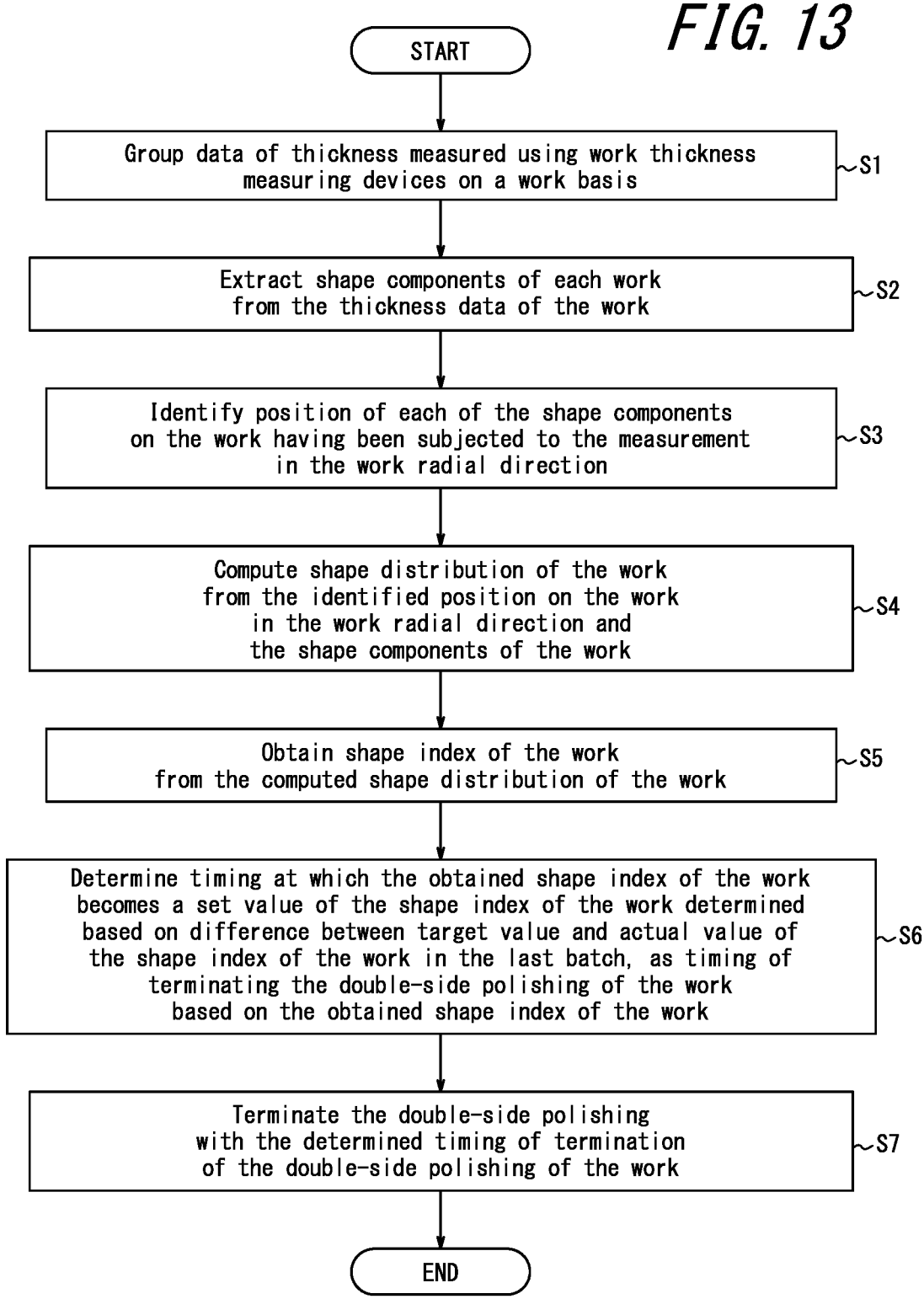
FIG. 13 is a flowchart of a double-side polishing method for a work, according to this disclosure.

FIG. 13 presents a flowchart of a double-side polishing method for a work, according to this disclosure. Since the method of this disclosure is the same as the method in which the computing unit 13 in the double-side polishing apparatus for a work according to this disclosure as described above determines the time when double-side polishing is terminated; thus, the method will be described briefly, and the detailed description will not be repeated.

First, before the determination of the timing, outliers are removed from the thickness data of the works subjected to measurements using the work thickness measuring devices 11, thereby obtaining the thickness data of the works that are constituted by only normal values. In step S1, the thickness data of the works thus obtained by removing outliers are separated on a work basis (first step). This can be performed, for example, based on the time intervals during which the thickness data of works are consecutively obtained.

Next, in step S2, for each work, the shape components of the work are extracted from the thickness data of the work (second step). This can be performed, for example, by approximating the thickness data of the works by a quadratic function and subtracting the changes in the average thickness of the works with time, obtained by the approximation by the quadratic function from the changes in the shape components of the works with time.

Subsequently, in step S3, for each extracted shape component of the works, the position on the work subjected to the measurement in the work radial direction is identified (third step). This allows for the identification of the position of each shape component on the wafer subjected to the measurement in the wafer radial direction by actually measuring the distance between the center of the sun gear 5 and the center of the monitoring hole 10, the rotation angle β of the carrier plate 9, and the revolution angle α of the carrier plate 9; or the identification of the position of each shape component of the wafer subjected to the measurement in the wafer radial direction by calculating by simulation measurable intervals during which the thickness of the work can be measured with respect to various conditions of the rotation speed of the upper plate 2, the revolution number of the carrier plate 9, and the rotation number of the carrier plate 9 and determining the rotation speed of the upper plate 2, the revolution number of the carrier plate 9, and the rotation number of the carrier plate 9 at which the calculated measurable interval intervals and actually measured intervals best match, as described above.

Next, in step S4, the shape distribution of the work is computed from the identified position of the work in the work radial direction and the shape components of the work (fourth step). In the case where the number of the shape components is small when the shape distribution is determined, approximation may be performed using an even function to obtain the shape distribution.

Subsequently, in step S5, the shape index of the work is obtained from the computed shape distribution of the work (fifth step). In this disclosure, the difference between the maximum value and the minimum value of the shape distribution of the work is used as the shape index of the work.

Subsequently, in step S6, timing at which the obtained shape index of the work becomes a set value of the shape index of the work, determined based on the difference between a target value and an actual value of the shape index of the work in the previous batch, is determined as timing of terminating the double-side polishing of the work (sixth step). In this step, the relationship between the shape index of the work and the polishing time is linearly approximated, and a polishing time after which the shape index of the work become a predetermined value (for example, zero) can be determined as the timing of terminating the double-side polishing of the works, from the straight line found by the approximation.

Further, the deviation of the shape described above can be favorably reduced by setting the set value of the shape index of the wafers W corresponding to termination of double-side polishing in the current batch as Y given by the following equation (4):

$$Y = C + ((A-B)/D) \times a \quad (4),$$

where A is the target value, B is the actual value, C is the set value of the shape index of the wafers W in the previous batch, D is a constant, and a is an adjustment sensitivity constant ($0 < a \leq 1$). The constant D in the equation (4) can be calculated by performing statistical analysis on the target value A and the actual value B of the multiple wafers W having been double-side polished.

Finally, in step S7, the double-side polishing is terminated with the determined timing of terminating the double-side polishing of the works. Thus, the double-side polishing can be terminated with timing allowing works having been polished to have a target shape.

EXAMPLES

Example

One hundred silicon wafers having a diameter of 300 mm were prepared, and these silicon wafers were subjected to double-side polishing according to the flowchart presented in FIG. 13. Further, in step S6, a set value of the shape index of the silicon wafers, corresponding to termination of double-side polishing was determined using the equation (3). The target value of GBIR and the GBIR of the silicon wafers having been double-side polished are given in FIG. 14.

Comparative Example

As with Example, 100 silicon wafers were subjected to double-side polishing. However, in step S6, a set value of the shape index of the silicon wafers, corresponding to termination of double-side polishing was set to the GBIR target value in Example in all batches. All the other conditions were the same as those in Example. The GBIR of the silicon wafers having been double-side polished are given in FIG. 14.

Conventional Example

As with Example, 100 silicon wafers were subjected to double-side polishing. Here, without performing steps S1 to S6 in FIG. 13, timing of termination of double-side polishing (polishing time) was determined from the actual value of the shape index of the wafers having been double-side polished, and the double-side polishing was terminated at the determined timing. The GBIR of the silicon wafers having been double-side polished are given in FIG. 14.

Figure 14:
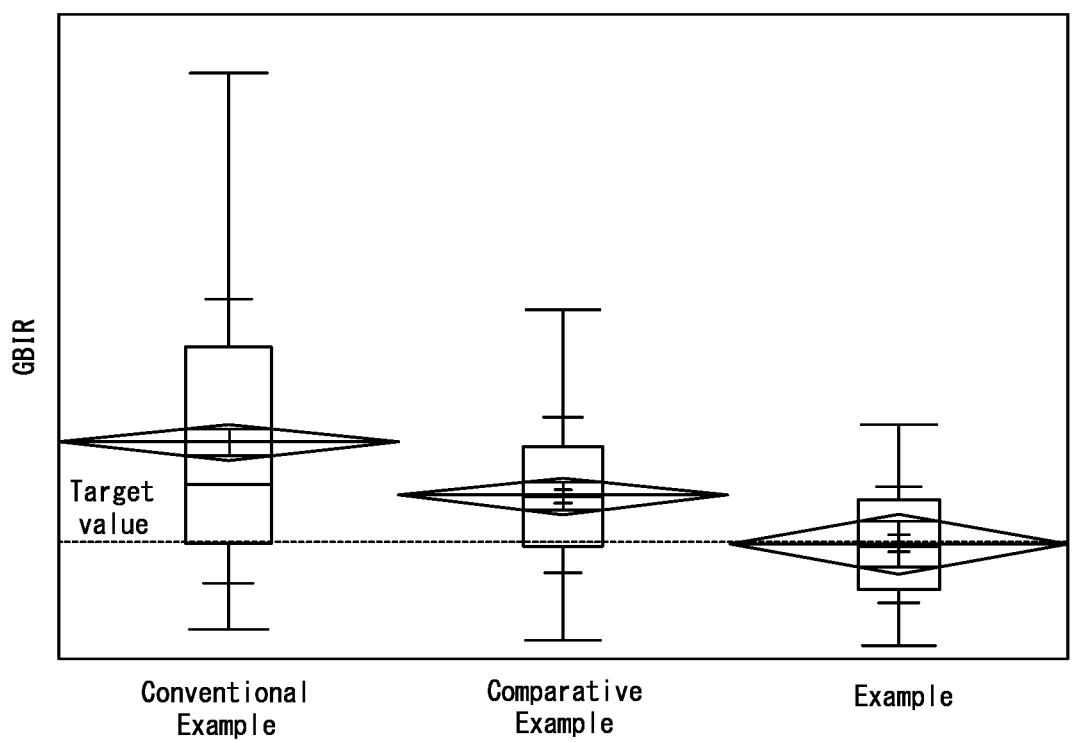
FIG. 14 is a diagram illustrating the GBIR of silicon wafers after double-side polishing.

As is clear from FIG. 14, in Conventional Example, the GBIR of the silicon wafers having been double-side polished was larger than the target value, and the GBIR greatly varied. On the other hand, in Comparative Example, it was found that determining timing of termination of double-side polishing based on the shape index of the silicon wafers, determined in steps S1 to S5 in FIG. 14 made small the difference between the average of the GBIR of the wafers and resulted in small variation of the GBIR. Further, in Example, it was found that the difference between the average and the target value of the GBIR of the wafers having been double-side polished was even smaller and the variation of the GBIR was also even smaller compared with Comparative Example.

INDUSTRIAL APPLICABILITY

The method and apparatus for double-side polishing of a work, according to this disclosure are useful in the semiconductor wafer manufacturing industry, since the timing of termination of double-side polishing is determined based on the shape index of a work, and the double-side polishing can be terminated during the double-side polishing with timing allowing a work having been polished to have a target shape.

REFERENCE SIGNS LIST

1: Double-side polishing apparatus
2: Upper plate
3: Lower plate
4: Rotating plate
5: Sun gear
6: Internal gear
7: Polishing pad
8: Wafer retainer opening
9: Carrier plate
10: Monitoring hole
11: Work thickness measuring device 12: Control unit
13: Computing unit
W: Wafer

The invention claimed is:

1. A double-side polishing apparatus for a work, including rotating plates having an upper plate and a lower plate, a sun gear provided at a center portion of the rotating plates, an internal gear provided at a peripheral portion of the rotating plates, and a carrier plate, which said carrier plate is provided between the upper plate and the lower plate provided with one or more wafer retainer openings for holding the work,
  wherein one of the upper plate and the lower plate has one or more monitoring holes penetrating from a top surface to a bottom surface of the one of the upper plate and the lower plate,
  the double-side polishing apparatus for the work comprises one or more work thickness measuring devices which is configured to measure a thickness of each work through the one or more monitoring holes in real time during double-side polishing of the work, and
  the double-side polishing apparatus comprises a computing unit for determining, during the double-side polishing of the work, a time of termination of the double-side polishing of the work, which the computing unit performs:
    a first step of grouping data of thicknesses of each work of a plurality of works on a work-by-work basis, the data of thicknesses of each work of the plurality of works being measured using the one or more work thickness measuring devices;
    a second step of extracting shape components of the each work by removing changes in a moving average thickness of the each work with respect to time from each of the data of thicknesses of the each work measured with respect to time, the moving average thickness of the each work being provided by averaging thickness data of the each work as measured and changes with respect to time;
    a third step of identifying a plurality of positions corresponding to each of the shape components on the each work in a work radial direction;
    a fourth step of computing a shape distribution of the each work from the identified plurality of positions on the each work in the work radial direction and the shape components of the each work;
    a fifth step of obtaining a shape index of the each work from the computed shape distribution of the each work; and
    a sixth step of determining a time of match at which the obtained shape index of the each work matches with a set shape index of the each work subjected to a current batch of polishing, the set shape index being determined based on a difference between a target shape index and an actual shape index of a previous work having been subjected to a previous batch of polishing, and setting the determined time of match as the time of termination of the double-side polishing of the each work subjected to the current batch of polishing,
  whereby terminating the double-side polishing with the determined time of termination of the double-side polishing of the each work.

2. The double-side polishing apparatus for the work, according to claim 1, wherein the set shape index Y of the each work subjected to the current batch of polishing is given by the following equation (1):

$$Y = C + ((A-B)/D) \times a \qquad (1),$$

where A is the target shape index, B is the actual shape index of the previous work having been subjected to the previous batch, C is the set shape index of the previous work having been subjected to the previous batch, D is a constant, and a is an adjustment sensitivity constant where $0 < a \leq 1$.

3. The double-side polishing apparatus for the work, according to claim 1, wherein in the third step, the position of each shape component of the each work subjected to the measurement in the work radial direction is identified by actually measuring a distance between a center of the sun gear and a center of the monitoring hole, a rotation angle of the carrier plate, and a revolution angle of the carrier plate; or the position of each shape component of the each work subjected to the measurement in the work radial direction is identified by calculating by simulation measurable intervals during which the thickness of the each work is configured to be measured under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable intervals and actually measured intervals match.

4. The double-side polishing apparatus for the work, according to claim 1, wherein in the sixth step, a relationship between the shape index of the each work and polishing time is linearly approximated, and a polishing time after which the shape index of the each work become a predetermined shape index is determined as the time of termination of the double-side polishing of the each work, from the straight line found by the approximation.

5. The double-side polishing apparatus for the work, according to claim 1, wherein in the fifth step, a relationship between the shape components of the each work and the position of each shape component of the each work in the work radial direction is approximated by an even function, and the shape index of the each work is determined based on a maximum value and a minimum value of the even function obtained by the approximation.

6. The double-side polishing apparatus for the work, according to claim 1, wherein in the first step, the thickness data of the plurality of works are grouped on the work-by-work basis based on time intervals during which the thickness data of the plurality of works are consecutively obtained.

7. The double-side polishing apparatus for the work, according to claim 1, wherein in the second step, a relationship between the thickness data of the each work and polishing time is approximated by a quadratic function, and a difference between the thickness data of the each work and the quadratic function obtained by the approximation is used as the shape component.

8. A double-side polishing method for a work, wherein the work is held in a carrier plate provided with one or more wafer retainer openings for holding the work; the work is sandwiched between rotating plates composed of an upper plate and a lower plate; rotation and revolution of the carrier plate are controlled by rotation of a sun gear provided at a center portion of the rotating plates and rotation of an internal gear provided at a peripheral portion of the rotating plates; and thus the rotating plates and the carrier plate are relatively rotated to simultaneously polish both surfaces of the work, one of the upper plate and the lower plate has one or more monitoring holes penetrating from a top surface to a bottom surface of the one of the upper plate and the lower plate, and the double-side polishing method for the work comprises, during double-side polishing of the work:
- a first step of grouping data of thicknesses of each work of a plurality of works on a work-by-work basis, the data of thicknesses of each work of the plurality of works being measured using one or more work thickness measuring devices configured to measure a thickness of the each work through the one or more monitoring holes in real time;
- a second step of extracting shape components of the each work by removing changes in a moving average thickness of the each work with respect to time from each of the data of thickness of the each work measured with respect to time, the moving average thickness of the each work being provided by averaging thickness data of the each work as measured and changes with respect to time;
- a third step of identifying a plurality of positions corresponding to each of the shape components on the each work in a work radial direction;
- a fourth step of computing a shape distribution of the each work from the identified plurality of positions on the each work in the work radial direction and the shape components of the each work;
- a fifth step of obtaining a shape index of the each work from the computed shape distribution of the each work; and
- a sixth step of determining a time of match at which the obtained shape index of the each work matches with a set shape index of the each work subjected to a current batch of polishing, the set shape index being determined based on a difference between a target shape index and an actual shape index of a previous work having been subjected to a previous batch of polishing, and setting the determined time of match as a time of termination of the double-side polishing of the each work subjected to the current batch of polishing, whereby terminating the double-side polishing with the determined time of termination of the double-side polishing of the each work.

9. The double-side polishing method for the work, according to claim 8, wherein the set shape index Y of the each work subjected to the current batch of polishing is given by the following equation (2):

$$Y = C + ((A-B)/D) \times a \quad (2),$$

where A is the target shape index, B is the actual shape index of the previous work having been subjected to the previous batch, C is the set shape index of the previous work having been subjected to the previous batch, D is a constant, and a is an adjustment sensitivity constant where $0 < a \leq 1$.

10. The double-side polishing method for the work, according to claim 8, wherein in the third step, the position of each shape component of the each work subjected to the measurement in the work radial direction is identified by actually measuring a distance between a center of the sun gear and a center of the monitoring hole, a rotation angle of the carrier plate, and a revolution angle of the carrier plate; or the position of each shape component of the each work subjected to the measurement in the work radial direction is identified by calculating by simulation measurable intervals during which the thickness of the each work is configured to be measured under various conditions of a rotation speed of the upper plate, a revolution number of the carrier plate, and a rotation number of the carrier plate and determining the rotation speed of the upper plate, the revolution number of the carrier plate, and the rotation number of the carrier plate at which the calculated measurable interval intervals and actually measured intervals match.

11. The double-side polishing method for the work, according to claim 8, wherein in the sixth step, a relationship between the shape index of the each work and polishing time is linearly approximated, and a polishing time after which the shape index of the each work become a predetermined shape index is determined as the time of termination of the double-side polishing of the each work, from the straight line found by the approximation.

12. The double-side polishing method for the work, according to claim 8, wherein in the fifth step, a relationship between the shape components of the each work and the position of each shape component of the each work in the work radial direction is approximated by an even function, and the shape index of the each work is determined based on a maximum value and a minimum value of the even function obtained by the approximation.

13. The double-side polishing method for the work, according to claim 8, wherein in the first step, the thickness data of the plurality of works are grouped on the work-by-work basis based on time intervals during which the thickness data of the plurality of works are consecutively obtained.

14. The double-side polishing method for the work, according to claim 8, wherein in the second step, a relationship between the thickness data of the each work and polishing time is approximated by a quadratic function, and a difference between the thickness data of the each work and the quadratic function obtained by the approximation is used as the shape component.

* * * * *